United States Patent [19]

Bruce et al.

[11] Patent Number: 5,552,718

[45] Date of Patent: Sep. 3, 1996

[54] ELECTRICAL TEST STRUCTURE AND METHOD FOR SPACE AND LINE MEASUREMENT

[75] Inventors: James A. Bruce, Williston; Michael S. Hibbs, Westford; Robert K. Leidy, Burlington, all of Vt.

[73] Assignee: International Business Machines Corp., Armonk, N.Y.

[21] Appl. No.: 368,181

[22] Filed: Jan. 4, 1995

[51] Int. Cl.⁶ ..................................................... G01R 31/26
[52] U.S. Cl. ..................... 324/765; 324/158.1; 324/699; 324/716
[58] Field of Search .................................. 324/699, 765, 324/716, 158.1; 437/7

[56] References Cited

U.S. PATENT DOCUMENTS

| | | |
|---|---|---|
| 3,650,020 | 3/1972 | Mar . |
| 3,974,443 | 8/1976 | Thomas . |
| 4,347,479 | 8/1982 | Cullet . |
| 4,516,071 | 5/1985 | Buehler . |
| 4,871,962 | 10/1989 | Cheung . |
| 4,956,611 | 9/1990 | Maltiel . |
| 4,978,923 | 12/1990 | Maltiel . |
| 5,082,792 | 1/1992 | Pasch et al. . |

OTHER PUBLICATIONS

"Pattern and Structure for Measuring electrically Both lines and Spaces of an Insulator" IBM Technical DIsclosure Bulletin vol. 32; No. 12; May 1990; pp. 240–241.

*Primary Examiner*—Kenneth A. Wieder
*Assistant Examiner*—Kourosh Cyrus Khosravi
*Attorney, Agent, or Firm*—Thornton & Thornton

[57] ABSTRACT

This describes a test pattern and method for measuring dimensional characteristics of features formed on a surface. This is realized and provided by forming a space, defined by the feature, in intersecting relationship with a pair of conductive lines of a test pattern configuration such that the lines are altered at the intersection with the space in accordance with the dimensions of that space, measuring the resistance of at least one of the lines in a region remote from the intersection with the space and the resistance of each line in the region of its intersection with the space, and comparing the resistance of the remote region with the resistances for the region of each of the lines where they intersect the space to thereby establish the position of, and at least one dimension of that space. A test structure wherein the spaced lines intersect the longitudinal ends of the space is utilized for determining the length and the longitudinal position of the space, and a test structure where lines intersect the lateral edges of the space is utilized for determining the width of and the lateral position of the space. For measuring the dimensional characteristics of a line feature, the above noted patterns are utilized, after first replicating the line as a space.

20 Claims, 5 Drawing Sheets

5,552,718

ELECTRICAL TEST STRUCTURE AND METHOD FOR SPACE AND LINE MEASUREMENT

FIELD OF THE INVENTION

This invention relates to a structure and method for measuring characteristics of semiconductor features and more particularly to a test structure and method for electrically measuring dimensional characteristics of semiconductor features.

BACKGROUND OF THE INVENTION

In the fabrication of semiconductor devices, aspects of required features can vary from the design characteristics due to a variety of causes. For example, features are often altered due to optical and etch difficulties. Among such variations, the length, width and position of a feature can be altered, corners may be rounded, and isolated lines can differ in their reproduction from identical lines surrounded by other features. Of particular concern is the foreshortening or decrease in actual length versus design length of a line or space, which can result in a plurality of problems as for example, opens between two metal levels, incorrect emitter open areas and shorting between features due to a failed intersection of deep trenches. Consequently, while the determination of the width or location of a feature is of importance, the determination of its length is often also vital for process control in the fabrication of semiconductors.

As expected, the above noted irregularities significantly complicate process control in the manufacture of integrated circuits. Presently, the increasingly smaller chip configurations expand the difficulties in providing precise features, and generally render present measurement techniques unsatisfactory. For instance, while the dimensions of a feature can be determined utilizing standard measurement techniques, such as by use of a Scanning Electron Microscope (SEM), the reduced size of the replicated features require ever more stringent calibration of such devices, and the latter measurement techniques still remain limited in precision, and in any event, are time consuming.

Electrical test structures, such as the basic bridge cross test resistor, are widely utilized for line width testing. Further, a standard electrical test structure can be used to measure width of a feature. Other electrical measurement techniques are available, for example, U.S. Pat. No. 3,974,443 teaches forming a pair of lines of different width interconnected for electrical comparison to determine the width of one of the lines, U.S. Pat. No. 4,516,071 describes the measurements of lines using a test pattern combining a Van der Pauw type cross resistor, a bridge resistor, and a longitudinally split-bridge resistor, and IBM Technical Disclosure, Vol. 32, No. 12, May 1990, teaches fabrication of a test structure designed for measuring both spaces and lines.

However, these test structures often require interconnection with the feature, and thus, in themselves can cause variations in the printed feature. That is, in some configurations, the printed length of a feature varies in accordance with the location of other features in its vicinity such that it must be printed in isolation to avoid foreshortening. Consequently, the amount of foreshortening exhibited by the feature may be dependent on whether the feature is printed in isolation or in the vicinity of other features required for the electrical measurement.

Additionally, U.S. Pat. No. 4,871,962 teaches the measurement of the width of square openings or the diameter of circular openings formed within a conductive line by measuring and comparing the resistance of the line with the resistance of an identical line without the openings. This, in turn, permits calculation of the width or diameter of the openings. The arrangement requires printing of the feature within the test line, and does not appear to be well suited to measuring of an elongated feature.

Accordingly, there exist a need for an improved testing technique which obviates the problems of the prior art and furnishes an electrical test structure and method for determining dimensional characteristics of a printed feature while minimizing distortion from the design specification for that feature.

SUMMARY OF THE INVENTION

An object of the present invention is to provide an improved test structure and method for determining the dimensional aspects of semiconductor features.

It is another object of the present invention to provide an improved test structure and method for electrically determining the location and dimensions of a semiconductor feature.

It is yet another object of the present invention to provide an improved test structure and method for electrically determining the length of a semiconductor feature.

It is a further object of the present invention to provide an improved test structure and method for electrically determining the width of a semiconductor feature.

It is a still further object of the invention to provide a test structure and method for electrically determining the location and dimensions of a space or line feature of a semiconductor device.

These desirable results and other objects are realized and provided by producing a semiconductor feature and a conductive test pattern in intersecting relation, and comparing the resistance of a portion of a test line of the pattern where it intersects the feature with the resistance of a portion of the test line remote from the intersection so as to establish dimensional aspects of the feature of interest. Preferably, the desirable results and objects are realized by producing a space representing the feature and a conductive test pattern comprising spaced apart test lines in intersecting relation with the space, and comparing the resistance of a region of each test line of the pattern where it intersects the space with the resistance of at least one of the test lines in a region remote from the intersection so as to establish the location and at least one dimensional aspect of the space.

These and other objects, features and advantages of the invention will be apparent from the following more particular description of the preferred embodiments of the invention as illustrated in the accompanying drawings.

DESCRIPTION OF THE PREFERRED EMBODIMENT

Basically, the present invention, as will be more fully set forth below, describes a test structure and method for determining the dimensional characteristics of a feature of a semiconductor integrated circuit.

Figure 3:
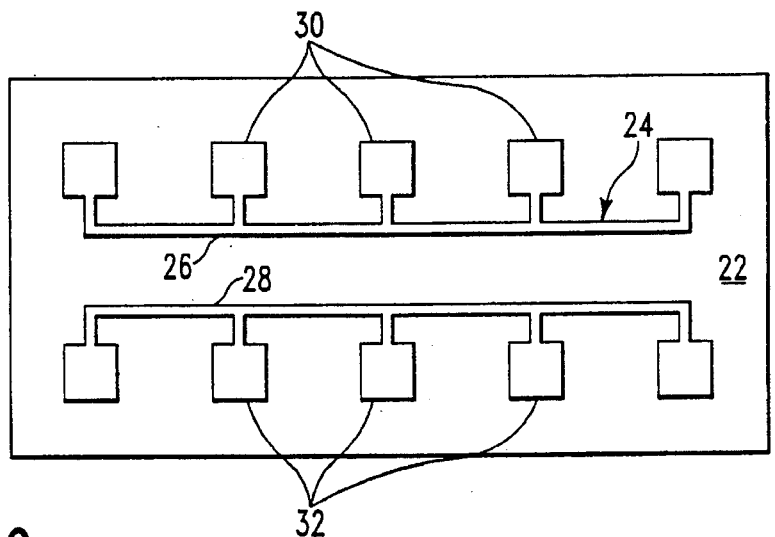
FIG. 3 is a plan view of a photomask providing a test pattern image configured for determining the length of the space illustrated in FIG. 2.
Figure 4:
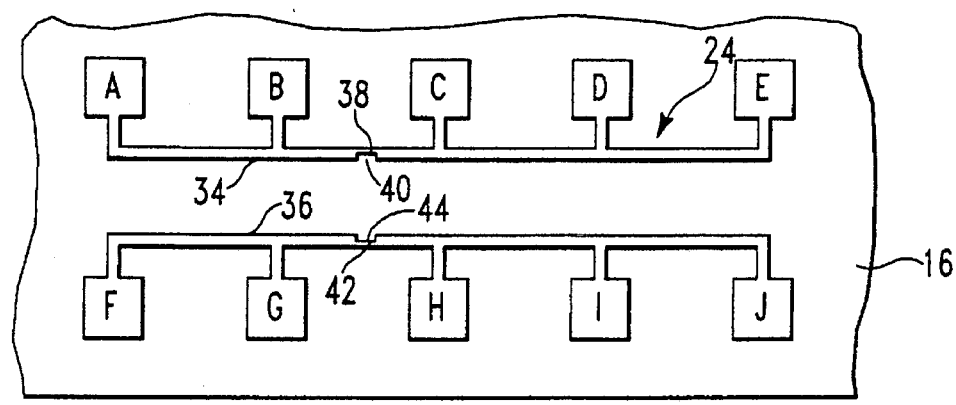
FIG. 4 is a plan view of the wafer of FIG. 2 patterned in accordance with the mask arrangement illustrated in FIG. 3.
Figure 5:
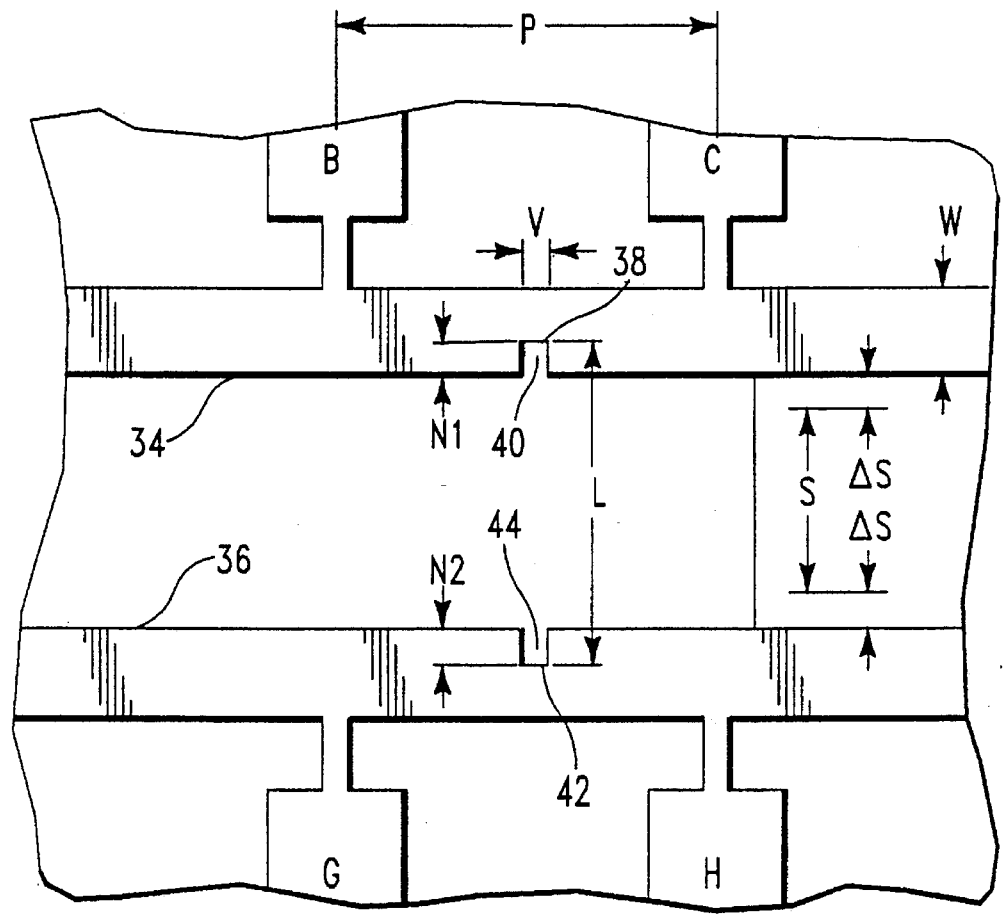
FIG. 5 is an enlarged plan view of the intersection of the space and test structure shown in FIG. 4.

Referring now to the drawings and particularly to FIGS. 1 to 6 thereof, one of the preferred embodiments of the invention will be described in accordance with the two level fabrication of a rectangular space in intersecting relation with a test structure for electrically determining the length and position of the space. FIGS. 1 through 4 are plan views showing the fabrication steps of forming an elongated space and a conductive test structure, configured for electrically measuring dimensional characteristics of the space, particularly its length and its position with respect to the longitudinal axis of the space, and FIG. 5 is a plan view illustrating information derived from the test structure shown in FIG. 5.

Figure 1:
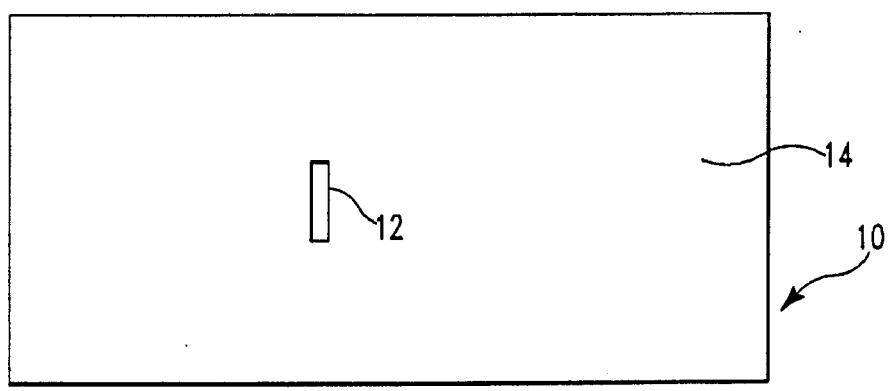
FIG. 1 is a plan view illustrating a photomask configured for lithographically producing a space in a semiconductor surface.
Figure 2:
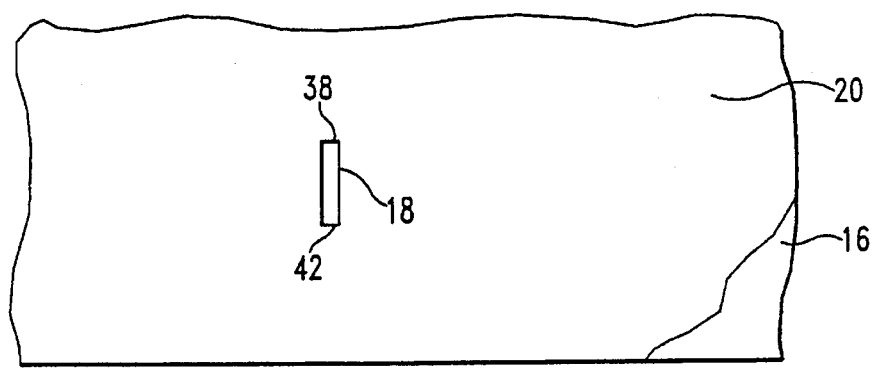
FIG. 2 is a plan view of a wafer having a space provided in a conductive surface layer thereof in accordance with the mask shown in FIG. 1.

FIG. 1 illustrates a conventional mask 10 providing an elongated, rectangular opening 12 in an opaque layer 14 designed for replication of a space on a substrate or wafer 16 by photolithographic transfer in the fabrication of a semiconductor chip. In FIG. 2, the opening 12 of the mask 10 is replicated as an elongated space 18 having longitudinal ends 38 and 42 in a conductive layer 20 overlying a section of the wafer 16. Preferably, the layer 20 is a substantially conductive layer such as a thin metallic layer of aluminum, for example, overlying a relatively less conductive substrate or surface coating thereof.

The space 18 is produced in the layer 20 in a conventional manner by first coating this layer with a positive photoresist (not shown), exposing the resist to an image of the mask opening 12, washing away the resist in the exposed region, and then etching the wafer 16 to remove the conductive layer 20 in the uncovered region thereby forming the space 18. At this stage in the method, as can be seen in FIG. 2, the conductive layer 20 remains over most of the wafer surface.

Following establishment of the space 18 in the conductive layer 20, the wafer 16 is then patterned as shown in FIG. 4. This is accomplished with the aid of a level 2 mask 22, illustrated in FIG. 3. As shown in the latter figure, the mask 22 carries an image of a test structure 24 formed by opaque surface portions of the mask. The test structure 24 comprises a pair of spaced apart parallel lines 26 and 28 of uniform width in connection with rectangular areas, generally designated at 30 and 32, for providing voltage and current test pads in the subsequently patterned wafer.

As previously indicated, the mask 22 is utilized to pattern the wafer 16 of FIG. 2 with the test structure 24, and to this end, it is reproduced in the conductive layer 20 by conventional photolithography, as previously described with regard to the level 1 fabrication. In this level 2 patterning, the etching step removes the conductive layer 20 surrounding the imaged test structure 24 thereby forming the lines 34 and 36 and their respective pads from the layer 20 on the wafer 16. Each of these lines 34 and 36, are uniformly interconnected, to five voltage and current test pads respectively, which are substantially equally spaced apart so as to simplify the test measurements, and designated as A, B, C, D and E in connection to the line 34, and F, G, H, I and J in connection to the line 36.

As will be later explained in more detail, the present embodiment is primarily designed to measure the length of the space 18. To this end, the mask 22 is designed to provide parallel, conductive lines 34 and 36, of uniform width of 1 to 5 microns on the wafer 16, with the lines spaced apart a distance just slightly less than the nominal length of the rectangular space 18, and the mask 22 is aligned back to the level 1 pattern of wafer 16 such that the lines 34 and 36 will intersect the longitudinal ends 38 and 42 of the space 18, as illustrated in FIGS. 4 and 5.

As a result of the above construction, the line 34 intersects the end 38 of the space 18 in the region of this line between its pads B and C such that the line is notched as designated at 40 whereas the line 36 intersects the other longitudinal end 42 of the opening between the pads G and H of this line such that it is notched as designated at 44. As can be understood, with a given separation between the lines 34 and 36, the size (length and depth) of the notches 40 and 44 are related to the position of and dimensions of the space 18. This relationship can be determined by comparing the resistance of the test lines in the region of their intersection, in the notch region, to the resistance of either of the test lines in a region remote from the intersection. Outside the intersection, each of the test lines should have the same resistance since they are designed to be identical, however, for more precision, each line can be separately measured in its region remote from the intersection with the space.

Now, the resistance of each line in the region of its intersection with the space 18, and its resistance away from that intersection can be determined by utilizing the voltage and current pads A to E for line 34 and F to J for line 36. For instance, the resistance of the line 34 in the region of the intersection can be measured by utilizing pads B and C as voltage taps and pads A and E as current taps, and the resistance of the line 34 remote from the intersection can be determined by utilizing the pads C and D as voltage taps and the pads B and E as current taps.

Likewise, the resistance of the line 36 in the region of its intersection with the space 18 may be measured by utilizing pads G and H as voltage taps and pads F and J as current taps, and the resistance of the line 36 in the region remote from its intersection with the space can be measured by utilizing pads H and I as voltage taps and pads G and J as current taps.

The sheet resistance of the lines 34 and 36 is established in a conventional manner by means of a nearby Van der Pauw circuit (not shown) formed from the same layer 20. Further, by utilizing the design length of the lines 34 and 36 between their pads, the width W of each of the lines 34 and 36 can also be calculated, for instance, by passing a known current along a given length of the line and measuring the voltage produced thereby.

By delivering a known current through each of the test lines 34 and 36 in the region of their intersection with the space 18 and through these test lines in a region remote from that intersection, the resistance of each of these regions can be determined. The difference, between the two resistances of each line, is determined by the size of the notch of that line, and with the measured resistivity of the lines as previously described, the notch size of each line can then be calculated. This can also be done in more empirical fashion by calibrating the resistance obtained for each region to the length and width of the notches as determined by SEM techniques.

The resistance of either line in the region of the notch can also be estimated by assuming three resistors in series, namely a first long wide rectangle, a narrow short rectangle and a second long wide rectangle. This estimate results in a resistance of $$R_2 = \sigma P/W \, (1+(VN_1/(PD(W-N_1))))$$

where $\sigma$ is the sheet resistance, P is the distance between the feed lines to the pads, and V is the width of the notch.

Alternately, the resistance can be calculated as given by P. M. Hall, Thin Solid Films, pp. 277–295, (1), 1967/1968 for the case of a diamond shaped or half-circular notch at the edge of a line.

Once the size of the notch is determined, the width of the space 18, (which defines the length of each notch), is utilized to establish the depth of each notch, designated in FIG. 5 as $N_1$ for the notch 40, and $N_1$ for the notch 44 of the lines 34 and 36, respectively. In any event, it can be seen that the size of the space 18 can be calculated by comparing the resistance of a line in a region remote from the notch to the resistance of each line in the region of its notch, and once the size of each notch is established, the position and length of the space 18 can be determined, if the width of the space 18 is known. Approximating the structure as three resistors, as described above, gives the following equation for the notch depth $N_1$:

$$N_1 = W/(V/(P((R_2/R_1)-1)))+1)$$

where $R_2$ is the measured resistance for the notch structure, $R_1$ is the measured resistance of a similar but un-notched structure, W is the width of the line, and P and V are as defined previously.

Alternately equations from P. M. Hall, Thin Solid Films, pp. 277–295, (1), 1967/1968.

For example, the space 18 can be assumed to have its nominal width. Its width can also be estimated, or can otherwise separately measured. Moreover in some chip designs, both the length and width of a long narrow feature may be of importance, whereas in others, it can be valuable merely to determine the length of a feature for a given line width, i.e., if the width is printed at its nominal dimension. Further, as later explained in detail with regard to FIGS. 6 and 7, the width of the space 18 can also be electrically measured by means of the inventive test structure illustrated in these figures.

With regard to the structure of FIG. 4, a mirror image test structure is employed to render the notch measurements insensitive to the alignment of the space 18 to the lines 34 and 36 such as can result from an imprecise alignment of level 2 back to level 1. That is, while a single line intersecting only one end of the space 18 can be utilized for determining the length of the space (assuming its width is known) the derived length would include any error in registration of that line with the space 18.

This follows from the fact that the size of the notch in a single test line is dependent upon both the length and width of the space 18 and also its location with respect to the line. Stated otherwise, the depth of the notch is not only due to the length of the line but also to the location of the space 18 normal to that line.

Consequently, while a single test line in intersecting relation with the space 18 may be sufficient under select circumstances, a test structure having a pair of spaced apart test lines is preferred. In the latter arrangement, the notch sizes depend upon the length and width of the space 18 and also on the separation of the test lines. Advantageously however, if the space 18 is not precisely centered along the direction generally normal to the lines 34 and 36, the two notches 40 and 44 will have different dimensions, but the differences in each notch will be complimentary and offset each other.

As a result, by comparing the resistance of each line in the region of its notch with its resistance in a region remote therefrom, the size of each notch can be separately determined, and the effect of misalignment will be alleviated as explained below with reference to FIG. 5.

Thus, the length L of the space 18 is as follows:

$$L = S + 2\Delta S + N1 + N2$$

Where:

S is the design space or separation between the parallel lines 34 and 36;

2 $\Delta S$ is the difference between the design separation of the test lines and the actual separation, where $\Delta S$ is one half the design of one of the test lines minus the actual width W as measured previously, and $$N_1 \text{ and } N_2$$

are the depths respectively of the notches 40 and 44.

These depths being determined (when the width of the space 18 is known) in accordance with the notch size established by the resistance comparisons noted above.

Advantageously, the difference in the notch depths, $N_1$ and $N_2$, is equal to the deviation of the space 18 from its design center along the normal to the lines 34 and 36. Hence, this difference is a measure of the location of the space to the normal, or that is, a measure of the longitudinal position of the space.

Figure 6:
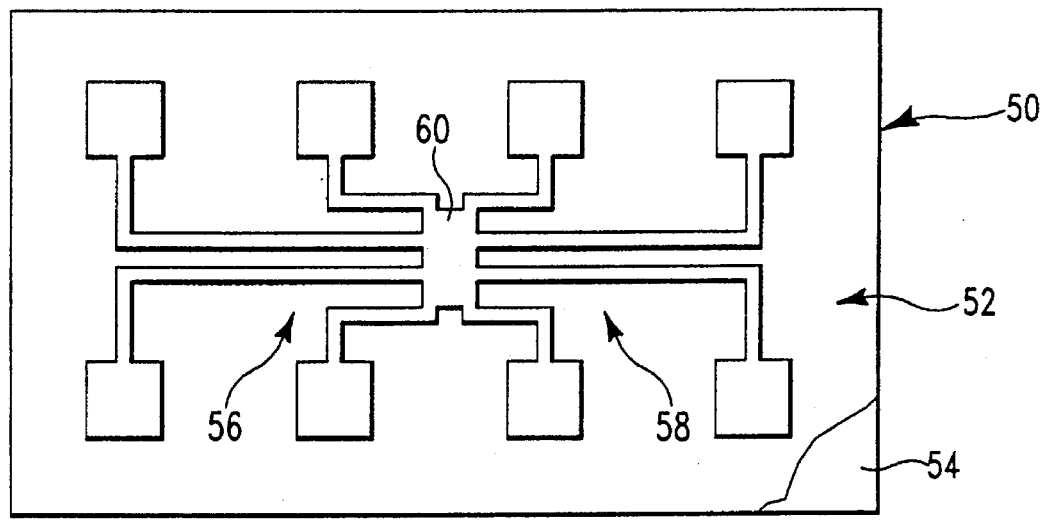
FIG. 6 is a plan view of a mask proving a test pattern image configured for determining the width of the space shown in FIG. 2.

The width of the space 18 (which effects the calculation of the length of the notch) can be measured utilizing the test structure imaged by the level 2 mask 50 as illustrated in FIG. 6. As shown therein, the mask 50 includes a test structure image 52 formed of opaque material, such as chromium, on a transparent support 54. The test pattern image 52 includes a mirror image arrangement comprising a rectangular feature 60 with two groups of four test pads, designated at 56 and 58, connected to opposite sides of the rectangular feature 60. The feature 60 is made slightly shorter than the nominal length of the space 18 but wider than the nominal width of the space. For example, the width of the conductive feature 60 is preferably in the order of three times the width of the space to be measured.

In the fabrication of a test site employing the mask 50, the level 1 configuration of FIG. 2 is patterned with the rectangular feature 60 centered on the space 18. In level 2, the layer 20 is removed in the manner described in regard to FIG. 4, from around the test image 52 to form a conductive test structure 62 on a relatively less conducting substrate or coating (not shown) of the wafer 16. The level 2 mask is aligned back to level 1 so that the space 18 bisects the rectangular feature 60 to form laterally spaced lines 64 and 66, connected to pads A, B, C and D and E, F, G and H, respectively.

Herein, the level 2 fabrication forms the pair of conductive test lines 64 and 66 on both sides of the space 18 with the width of these lines being inversely related to the width of the space 18. By measuring these two widths, and using a measurement of the line width of a standard bridge cross test resistor made using only level 2 (to remove effects of line width variations due to under or overexposure of level 2), one can derive the space width printed in level 1.

As in the prior embodiment, the mirror image arrangement will make the test structure alignment insensitive, since the difference in width of one line 64 will be the complement of and offset by that of the opposing line 66.

Figure 7:
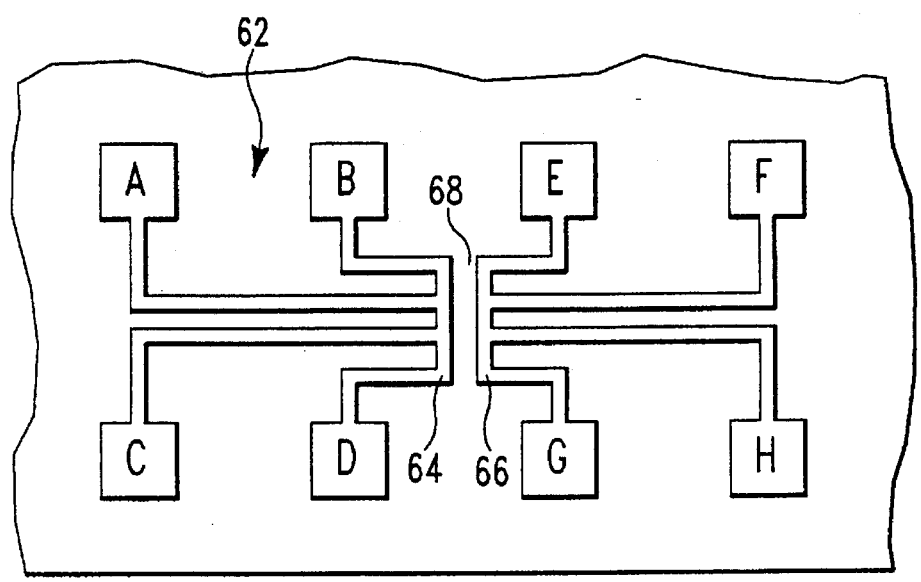
FIG. 7 is a plan view illustrating the wafer shown in FIG. 2, patterned in accordance with the mask arrangement shown in FIG. 6.

It should be understood that while it is preferable to implement level 1 first, the test structure embodiments described in regard to FIGS. 4 and 7 could be implemented with level 2, followed by level 1. However, this would have the disadvantage that the space 18 transferred from the level 1 mask would be printed over topography, such that its dimensions could be adversely influenced by, among other things, reflectivity issues. Although, a dyed resist could be used to minimize differences in reflectivity, the topography problem is still not as severe an issue if the level 2 is printed last, since the size of its features are not as critical.

It should be understood, that while the embodiments described with respect to FIGS. 1 to 7, depict the measuring of elongated spaces, particularly rectangular, they are applicable to semiconductor features of various shapes and sizes, for example, square or round as well as irregular configurations. Furthermore, while these embodiments were directed to the measuring of the position, length or width of a space, the test structures depicted therein can also, advantageously Be utilized for measuring a line feature.

In the method of measuring a line in accordance with the invention, a space representative of the line of interest, is ultimately formed in intersecting relation with the above described test structures. This is accomplished by first forming a line, and then forming a space representative of that line. The space is then measured utilizing test patterns identical to those previously described, however, the fabrication of a line-representing space in conjunction with the test pattern images shown in FIGS. 3 and 6, requires different fabrication steps from those previously described.

Figure 8:
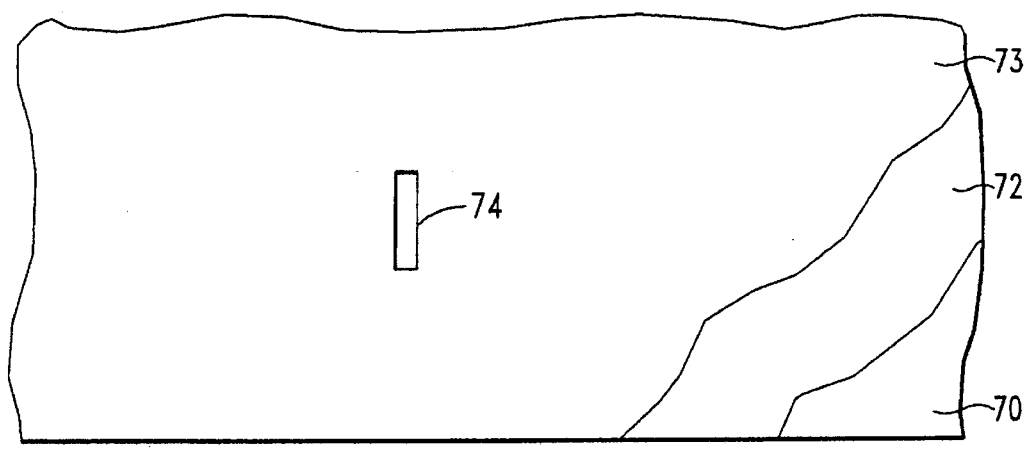
FIG. 8 is a plan view illustrating a level 1 composition provided in the fabrication of a test structure designed for testing the length of a line.

In accordance with the invention, the process for measuring the length of a line is described with regard to FIGS. 8 to 11. In this process, a polysilicon layer 72 shown in FIG. 8, is formed by a conventional method on a wafer 70 or a surface coating thereof (not shown). The polysilicon layer 72 is coated by a nitride film 73 which is patterned using the level 1 mask shown in FIG. 1, and the nitride subsequently etched away in a conventional manner to leave only a nitride rectangle forming the line 74.

Figure 9:
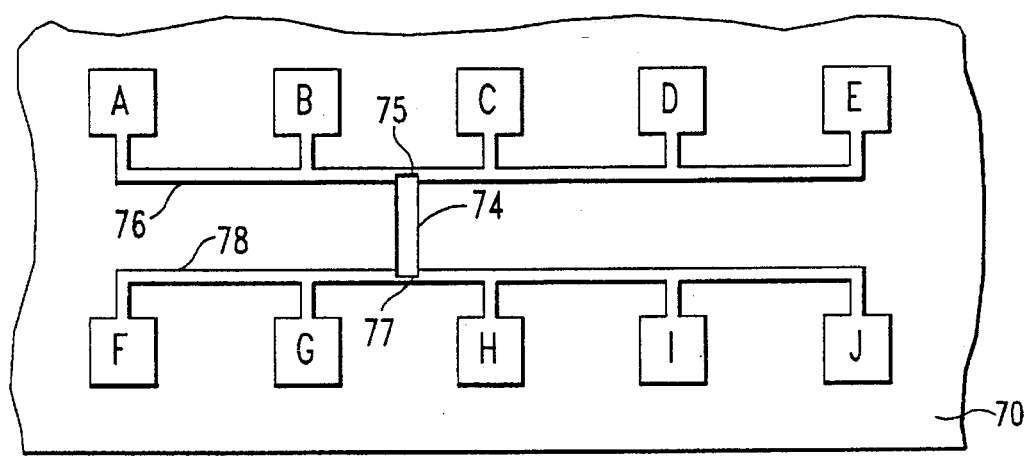
FIG. 9 is a plan view illustrating the combination of the level 2 pattern of FIG. 3 with the test configuration shown in FIG. 8.
Figure 10:
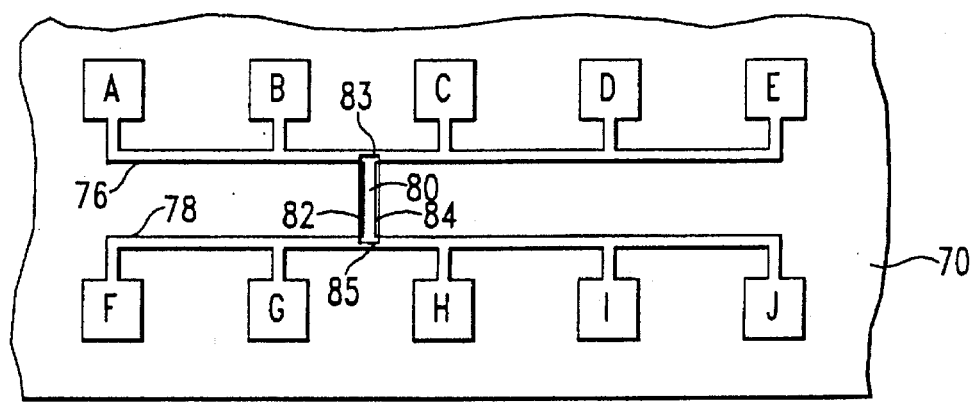
FIG. 10 is a plan view of the test structure shown in FIG. 9 following treatment with a further step to replace the line feature of this embodiment with a space.

Following the fabrication of the nitride line 74 on the layer 72, the layer 72 is coated with a photoresist (not shown) which is then exposed to the level 2 mask shown in FIG. 3 following which the photoresist is developed and exposed polysilicon etched away using a suitable reactive ion etch sequence, e.g., using chlorine based chemistries that is selective to only the polysilicon and leaves both the nitride and the resist undisturbed to produce the combined pattern illustrated in FIG. 9. This provides a pair of polysilicon test lines 76 and 78 connected to pads A to E and F to J respectively. Because the nitride line 74 protects the polysilicon lying thereunder, the lines 74 and 76 are connected by a bridge of polysilicon 80 underlying the nitride line 74 as shown in FIG. 10.

Figure 11:
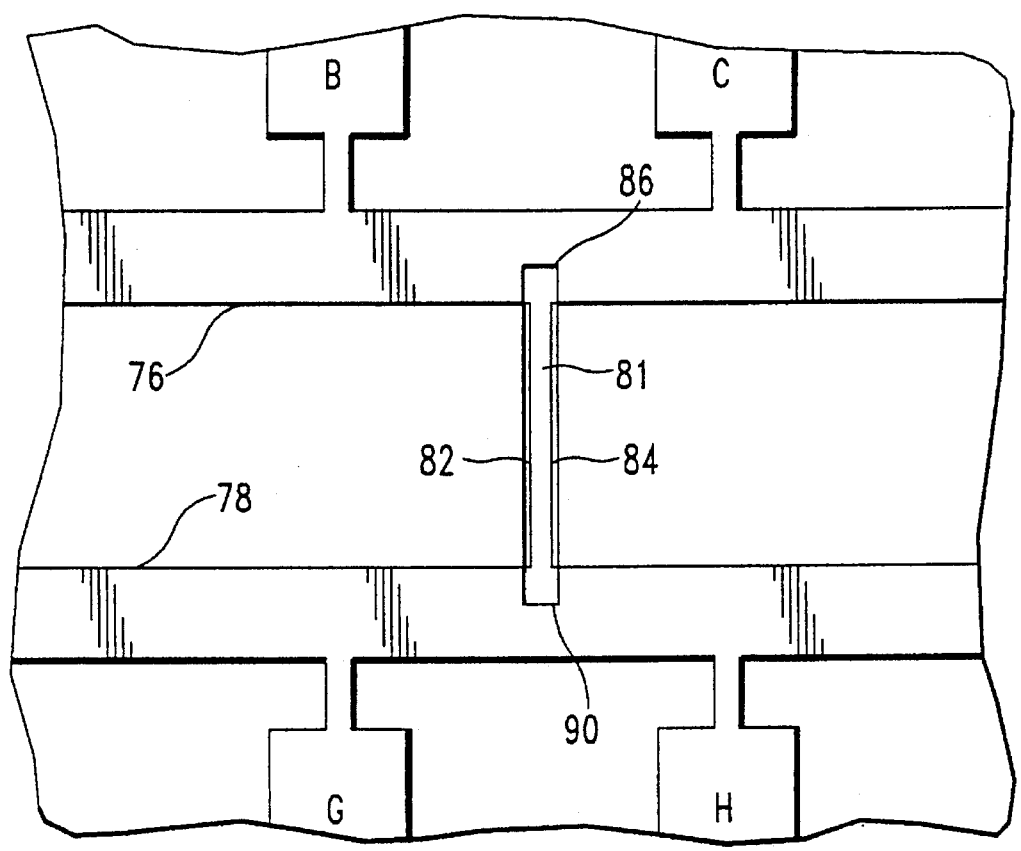
FIG. 11 is a greatly enlarged plan view of the intersection between the lines of the test structure and the space illustrated in FIG. 10.

Next, the photoresist is striped and the exposed polysilicon surface is oxidized. The entire surface of the polysilicon pattern, i.e., the lines 76 and 78 and the pads A to J, is oxidized, except where protected by the nitride line 74. The polysilicon bridge 80, underlying the nitride line 74, is oxidized only on its exposed side surfaces as shown, in FIG. 10, by oxide sidewalls 82 and 84. The top surface of the polysilicon bridge 80 and the areas 83 and 85 of the lines 76 and 78, respectively, protected by the ends 75 and 77 of line 74 are not oxidized because of the protecting nitride line 74 but the sides of the bridge, being unprotected are oxidized. The nitride line 74 is now stripped, in a conventional manner, using for instance, a selective reactive ion etch which will not affect either the oxidized or unoxidized polysilicon. The removal of the nitride layer 74 leaves exposed the bridge 80 as well as the unoxidized regions 83 and 85 in the line 76 and 78. Finally, the unoxidized polysilicon, i.e, the bridge 80 and the regions 83 and 85, is etched away with a selective etch, such as a chlorine based chemistry, which will not affect the oxidized polysilicon. This results in a space 81 extending between, and in intersecting relation, i.e., forming notches 86 and 90, with the spaced conductive polysilicon lines 76 and 78 as illustrated in FIGS. 10 and 11. Because of the selective oxide etch, the space 81 is formed between thin oxide sidewalls 82 and 84 extending between the lines 76 and 78, as shown more clearly in FIG. 11. Of course, the sidewalls 82 and 84 do not extend into the notches 86 and 90 and thus, do not interfere with the dimensions of the notches 86 and 90, which are now measured as described above in conjunction with the embodiment illustrated in FIGS. 4 and 5. In fact, the sidewalls 82 and 84 can expedite the determination of the length of the space 80 by facilitating an SEM measurement of the width of the space.

It should be understood from the above, that once the line is represented by a space in intersecting relation with the test structure, the length and position of the space 80 (and thus,line 74) can be determined in the manner previously described with respect to the test structure illustrated in FIG. 5. Further, the just described fabrication process can also be utilized with the level 2 mask illustrated in FIG. 6 to effectuate electrical measurement of the width of the line 74. This is accomplished by employing the fabrication steps described with respect to FIGS. 9 to 11 and the measurement techniques previously described in regard to FIG. 7.

An alternative process for constructing a test site for measuring a line would be to deposit an undoped polysilicon on a wafer, pattern it with a nitride line, and silicide the patterned surface except for the nitride line. Another possibility would be to use the resist as an implant mask, and to dope intrinsic poly using this implant.

This completes the description of the preferred embodiments of the invention. Since changes may be made in the above structure and process without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. A method of measuring a dimensional characteristic of a feature, the method comprising the steps of:

a) forming a substantially conductive layer on a substrate;

b) forming a space representing the feature and a test structure in said layer with said test structure having at least one line in intersection with an edge of said space, said space being formed exteriorly of said line and extending into intersection therewith to form a notch in one edge thereof such that said one line is altered at said intersection in accordance with the dimensional characteristics of said space, said space being formed by removal of said conductive layer in the area of said space, and said line being formed by the removal of said conductive layer around said test structure, c) measuring a first resistance of said line in a region remote from said intersection and a second resistance of said line in the region of said intersection; and d) comparing said first and said second resistances to establish at least one dimensional characteristic of said space and the feature represented thereby.

2. The method of claim 1 wherein said test structure comprises a pair of spaced apart lines in intersecting relation with opposing edges of said space to form a notch in the inside edge of each line, and said measuring and comparing steps include measuring and comparing the resistances of said lines in the region of said notches and in a region remote therefrom.

3. The method of claim 1 wherein said test structure comprises a pair of spaced apart lines, and said forming step includes forming said space and said test structure such that said space is located between said lines with its opposing edges in intersection therewith to form a notch in the inside edge of each line, and said measuring and comparing steps include measuring and comparing the resistances of said lines in the region of said notches and in a region remote therefrom.

4. The method of claim 3 wherein the separation of said lines is equal to or slightly less than the nominal value of the dimension of said space normal to said lines.

5. The method of claim 4 wherein the sum of the widths of each of said lines plus the separation between said lines exceeds the dimension of said space normal to said lines.

6. The method of claim 4 wherein said space is formed as an elongated space, and said lines are in intersecting relation with the longitudinal ends of said elongated space.

7. The method of claim 1 wherein said space is formed as an elongated space, and said forming step includes forming said space and said test structure with one of the longitudinal ends of said elongated space in intersection with said one line, and said resistances are compared to establish the length of said space.

8. The method of claim 7 wherein said test structure is formed as a pair of spaced apart generally parallel lines, and said space and said test structure are formed with the space positioned between said lines and with its longitudinal ends in intersection with said lines to form a notch in the inside edge of each line, and said measuring and comparing steps include measuring and comparing the resistances of said lines in the region of said notches to the resistance of said lines in a region remote therefrom.

9. The method of claim 8 wherein the length of said space is determined by:

$$L = S + S\Delta S + N1 + N2$$

Where:

L is the length of interest,

S is the design separation between the lines, $2\Delta S$ is the difference between the design separation and the actual separation, and $N_1$ and $N_2$ are the depths of the notches formed at the intersection with the lines.

10. The method of claim 1 wherein said forming step comprises forming said test structure with a conductive test area interconnected at opposing sides to test pads, said test area having a length less than the length of said space so that said space bisects said conductive area to thereby form a pair of spaced apart lines whose resistance is related to the width of said space.

11. A method of measuring the dimensions of a semiconductor feature, the method comprising the steps of:

a) forming a substantially conductive layer on a relatively less conducting surface;

b) forming a coating of selectively etch resistant material on at least a portion of said conductive layer;

c) forming a line representative of said feature in said selectively etch resistant material by removing the selective etch resistant material from around the feature representing line;

d) forming a test structure in said conductive layer with an edge of at least one line thereof in underlying relation with one edge of said feature representing line by removing the conductive layer around said test structure except beneath said feature representing line;

e) stripping said feature representing line from the surface of said conductive layer;

f) removing the portion of said conductive layer previously underlying said feature representing line to form a space in said conductive layer representative of said feature with one edge of said space in intersecting relationship with said one line of said test structure such that a notch is formed in said one edge of said one line at its intersection with said space;

g) measuring the resistance of said one line in a first region remote from its intersection with said space and the resistance of said one line in a second region at said intersection with said space; and h) comparing the resistance of said first and second regions of said one line to establish the location or at least one dimensional characteristics of said space and the feature represented thereby.

12. The method of claim 11 wherein said test structure is formed in said conductive layer as a pair of spaced apart lines with the feature representing line bridging said spaced lines and overlying a portion of said conductive layer located therebetween and in intersection therewith such that when said feature representing line is stripped and said underlying portion of said conductive layer removed, a space is formed extending between said lines and in intersection therewith to form a notch in the inside edge of each of said lines, and said measuring and comparing steps include measuring and comparing the resistances of said lines in the region of said notches to the resistance in a region remote therefrom.

13. A method of measuring the dimensions and the position of a select defined area, the method comprising the steps of:

a) forming a conductive layer on a relatively less conducting surface;

b) forming a space representative of said defined area in said conductive layer by removing the conductive layer in the defined area;

c) forming spaced apart lines in said conductive layer in intersecting relation with opposing edges of said space by removing the conductive layer around said lines, said opposing edges of said space defining a notch in the intersected edges of each of said lines;

d) measuring the resistance of the lines outside their intersection with said space;

e) measuring the resistance of the lines at their intersection with said space; and f) establishing the dimensions of the defined area by determining the differences between the resistance of the lines outside the intersection and the resistance of each of the lines where they include the intersection.

14. The method of claim 13 wherein the separation of said lines is equal to or slightly less than the nominal value of the dimension of said defined area normal to said lines.

15. The method of claim 14 wherein the width of each of said lines plus the separation between said lines exceeds the dimension of said defined area normal to said lines.

16. The method of claim 15 wherein said space is formed as an elongated space, and said lines are in intersecting relation with the longitudinal ends of said elongated space.

17. The method of claim 13 wherein said defined area is formed as an elongated area, said lines are in intersecting relation with the longitudinal ends of said elongated area, and said establishing step includes establishing the length of said defined area.

18. A method of measuring a dimensional characteristic of a feature, comprising the steps of:

depositing a conductive layer on the surface of an insulative substrate;

forming a test structure in said conductive layer by removing selected regions of said conductive layer from said surface, said test structure having a width greater than the width of said feature that is to be measured;

measuring the resistance of the conductive layer of said test structure;

creating an image of said feature in said test structure by removing selected regions of said test structure to leave a pair of spaced lines in said test structure;

measuring the resistance of each of said spaced lines; and comparing the measured resistance of said lines to the measured resistance of said test structure to determine the width of said image created in said test structure.

19. The method of claim 18 wherein the test structure includes a plurality of test pads coupled to each edge of said test structure.

20. The method of claim 18 wherein said forming step comprises forming said space as an elongated space and said test structure as comprising generally parallel spaced lines in intersecting relation with the longitudinal sides of said elongated space to form a notch in the inside edge of each line, and said resistances are compared to establish the width of said space and said measuring and comparing steps include measuring and comparing the resistances of said lines in the region of said notches to their resistance in a region remote therefrom.

* * * * *